US012772758B2

(12) United States Patent
Chiang

(10) Patent No.: US 12,772,758 B2
(45) Date of Patent: Oct. 20, 2026

(54) METHOD OF MANUFACTURING SEMICONDUCTOR STRUCTURE

(71) Applicant: NANYA TECHNOLOGY CORPORATION, New Taipei City (TW)

(72) Inventor: Yubon Chiang, New Taipei City (TW)

(73) Assignee: NANYA TECHNOLOGY CORPORATION, New Taipei City (TW)

( * ) Notice: Subject to any disclaimer, the term of this patent is extended or adjusted under 35 U.S.C. 154(b) by 204 days.

(21) Appl. No.: 18/889,356

(22) Filed: Sep. 18, 2024

(65) Prior Publication Data

US 2026/0082831 A1 Mar. 19, 2026

(51) Int. Cl.

| | |
|---|---|
| ***H10P 14/60*** | (2026.01) |
| ***C23C 16/44*** | (2006.01) |
| ***H10P 50/00*** | (2026.01) |
| ***H10P 50/28*** | (2026.01) |

(52) U.S. Cl.

CPC ...... *H10P 14/6336* (2026.01); *C23C 16/4408* (2013.01); *H10P 14/6532* (2026.01); *H10P 50/283* (2026.01); *H10P 50/695* (2026.01)

(58) Field of Classification Search

None

See application file for complete search history.

(56) References Cited

U.S. PATENT DOCUMENTS

| | | | | |
|---|---|---|---|---|
| 6,245,669 | B1 | 6/2001 | Fu et al. | |
| 6,562,690 | B1 | 5/2003 | Cheung et al. | |
| 6,686,272 | B1 | 2/2004 | Lee et al. | |
| 8,236,700 | B2 * | 8/2012 | Cole | H10P 50/283 438/689 |
| 2004/0198065 | A1 * | 10/2004 | Lee | H10P 50/692 257/E21.232 |
| 2007/0281491 | A1 * | 12/2007 | Kamp | H10P 50/283 438/719 |
| 2018/0308693 | A1 * | 10/2018 | Kamp | H01J 37/321 |
| 2021/0183644 | A1 * | 6/2021 | Hsieh | H10P 76/204 |

* cited by examiner

*Primary Examiner* — Shamim Ahmed

(74) *Attorney, Agent, or Firm* — CKC & Partners Co., LLC

(57) ABSTRACT

A method of manufacturing a semiconductor structure includes forming bit line structures on a substrate; forming a dielectric layer on the substrate and between the bit line structures; forming a layer stack including a plasma treated oxygen-rich ARC layer and a silicon-rich ARC layer on the dielectric layer; forming a patterned mask layer including a mask feature and an opening on the layer stack, the opening has a first width smaller than a pitch between adjacent two of the bit line structures; trimming the patterned mask layer to enlarge the opening such that the opening has a second width greater than the first width; patterning the layer stack by using patterned mask layer as a mask after trimming the patterned mask layer; and etching the substrate to form a contact hole between the bit line structures by using the patterned layer stack as a hard mask.

20 Claims, 14 Drawing Sheets

S10

S16

METHOD OF MANUFACTURING SEMICONDUCTOR STRUCTURE

BACKGROUND

Field of Invention

The present disclosure relates to a method of manufacturing a semiconductor device.

Description of Related Art

Semiconductor devices are used in a variety of electronic applications, such as personal computers, cellular phones, digital cameras, and other electronic equipment. The semiconductor devices are typically fabricated by sequentially depositing insulating or dielectric layers, conductive layers, and semiconductive layers of material over a semiconductor substrate, and patterning the various material layers using lithography to form circuit components and elements thereon. As the semiconductor industry has progressed into advanced technology process nodes in pursuit of greater device density, higher performance, and lower costs, challenges of precise control of lithography across a wafer have arisen.

SUMMARY

An aspect of the disclosure provides a method of manufacturing a semiconductor structure. The method includes forming a plurality of bit line structures on a substrate; forming a dielectric layer on the substrate and between the bit line structures; forming a layer stack on the dielectric layer, wherein the layer stack includes a plasma treated oxygen-rich anti-reflective coating (ARC) layer and a silicon-rich ARC layer on the plasma treated oxygen-rich ARC layer; forming a patterned mask layer on the layer stack, wherein the patterned mask layer includes a mask feature and an opening defined by the mask feature, the opening has a first width smaller than a pitch between adjacent two of the bit line structures; trimming the patterned mask layer to enlarge the opening such that the opening has a second width greater than the first width; patterning the layer stack by using patterned mask layer as a mask after trimming the patterned mask layer; and etching the substrate to form a contact hole between the bit line structures by using the patterned layer stack as a hard mask.

In some embodiments, the trimming the patterned mask layer includes a directional dry etching or a tilt etching.

In some embodiments, a sidewall of the opening having the second width is not vertical to a top surface of the layer stack.

In some embodiments, the second width of the opening is gradually decreased from a top surface to a bottom surface of the mask feature.

In some embodiments, the second width of the opening is stepping decreased from a top surface to a bottom surface of the mask feature.

In some embodiments, the second width is equal to the pitch between adjacent two of the bit line structures.

In some embodiments, forming the layer stack includes: forming a first layer including oxygen on the dielectric layer; forming a second layer including oxygen on the first layer; forming a third layer including carbon on the second layer; forming an oxygen-rich ARC layer on the third layer; performing a plasma treatment process to the oxygen-rich ARC layer; and forming the silicon-rich ARC layer on the plasma treated oxygen-rich ARC layer.

In some embodiments, the plasma treatment process includes using He and $N_2O$ as reaction gas.

In some embodiments, a treatment power of the plasma treatment process is in a range from 800 W to 1000 W.

In some embodiments, forming the layer stack includes forming an under layer includes photoresist on the silicon-rich ARC layer, and the patterned mask layer is formed on the under layer.

In some embodiments, the oxygen-rich ARC layer is formed in a first deposition chamber, and the silicon-rich ARC layer is formed in a second deposition chamber.

In some embodiments, the plasma treatment process is performed in the first deposition chamber.

In some embodiments, the oxygen-rich ARC layer and the silicon-rich ARC layer are formed in the same plasma enhanced chemical vapor deposition process (PECVD) chamber.

In some embodiments, the plasma treatment process is performed in the PECVD chamber.

In some embodiments, the method further includes forming a capacitor contact in the contact hole.

Another aspect of the disclosure provides a method of manufacturing a semiconductor structure. The method includes forming a plurality of bit line structures on a substrate; forming a dielectric layer on the substrate and between the bit line structures; depositing an oxygen-rich anti-reflective coating (ARC) layer on the dielectric layer; performing a plasma treatment process to the oxygen-rich ARC layer, wherein the plasma treatment process includes using He and $N_2O$ as reaction gas, and a treatment power of the plasma treatment process is in a range from 800 W to 1000 W; and forming a silicon-rich ARC layer on the plasma treated oxygen-rich ARC layer.

In some embodiments, the oxygen-rich ARC layer is deposited in a first deposition chamber, and the silicon-rich ARC layer is deposited in a second deposition chamber.

In some embodiments, the plasma treatment process is performed in the first deposition chamber.

In some embodiments, the oxygen-rich ARC layer and the silicon-rich ARC layer are deposited in the same plasma enhanced chemical vapor deposition process (PECVD) chamber.

In some embodiments, the plasma treatment process is performed in the PECVD chamber.

It is to be understood that both the foregoing general description and the following detailed description are by examples, and are intended to provide further explanation of the disclosure as claimed.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DESCRIPTION OF THE EMBODIMENTS

Figure 1:
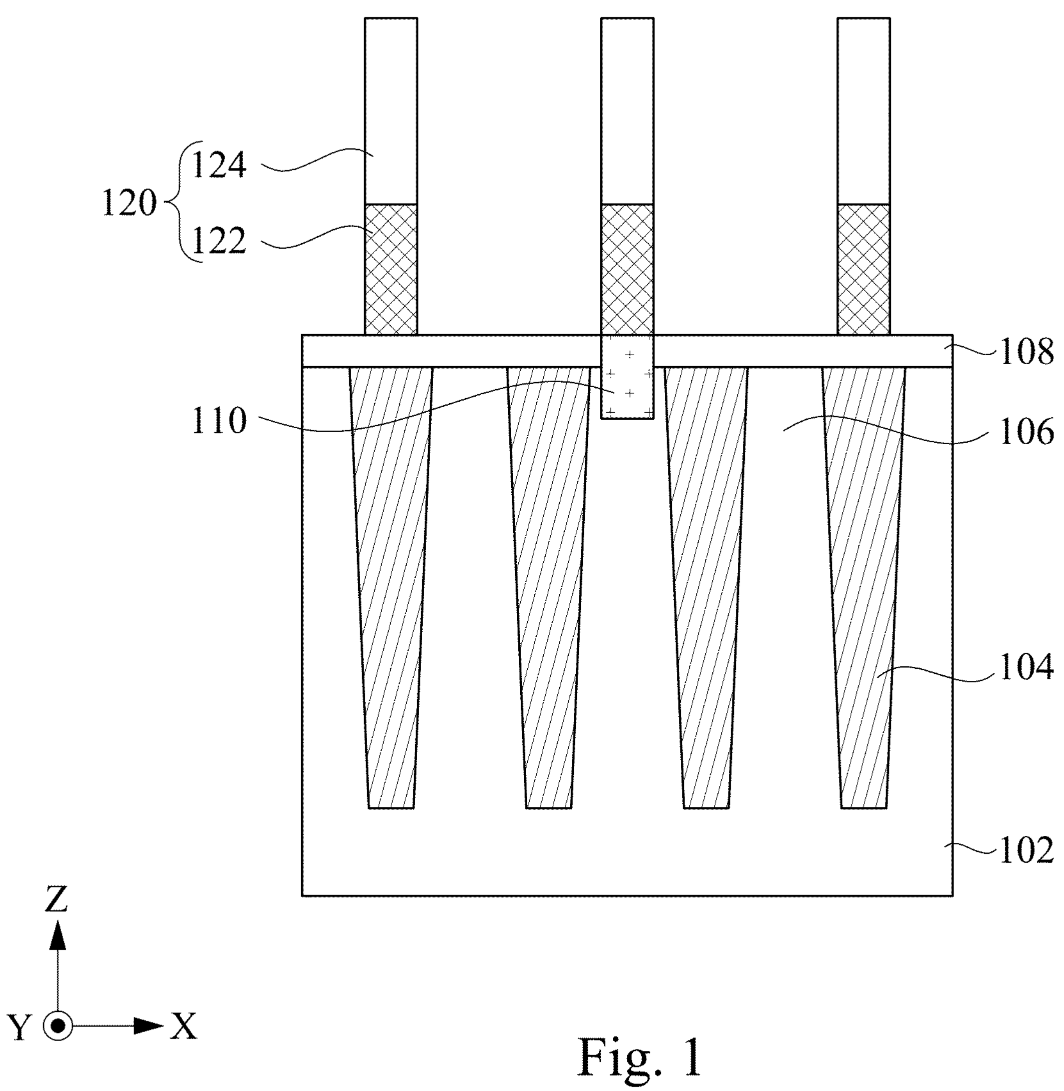
FIG. 1 to FIG. 11 are cross-sectional views illustrating different steps of a method of forming a semiconductor device in accordance with some embodiments of the present disclosure.

Reference will now be made in detail to the present embodiments of the disclosure, examples of which are illustrated in the accompanying drawings. Wherever possible, the same reference numbers are used in the drawings and the description to refer to the same or like parts.

Further, spatially relative terms, such as "on," "over," "under," "between" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The words "comprise", "include", "have", "contain" and the like used in the present disclosure are open terms, meaning including but not limited to.

Various operations of embodiments are provided herein. The order in which some or all of the operations are described should not be construed to imply that these operations are necessarily order dependent. Alternative ordering will be appreciated having the benefit of this description. Further, it will be understood that not all operations are necessarily present in each embodiment provided herein.

Reference is made to FIG. 1 to FIG. 11. FIG. 1 to FIG. 11 are cross-sectional views illustrating different steps of a method of forming a semiconductor device in accordance with some embodiments of the present disclosure. Referring to FIG. 1, the method of forming the semiconductor structure begins at step S10, at least one bit line contact 110 formed over a substrate 102.

The substrate 102 includes a plurality of isolation areas 104 and a plurality of active areas 106. The substrate 102 may include, for example, silicon (e.g., crystalline silicon, polycrystalline silicon, or amorphous silicon). In some embodiments, the substrate 102 may include other elementary semiconductor such as germanium. In some embodiments, the substrate 102 may include an alloy semiconductor such as silicon germanium, silicon germanium carbide, gallium indium phosphide and the like. In some embodiments, the substrate 102 may include compound semiconductor such as gallium arsenic, silicon carbide, indium phosphide, indium arsenide and the like. Further, the substrate 102 may optionally include a semiconductor-on-insulator (SOI) structure. The active areas 106 may be doped regions of the substrate 102, and the active areas 106 are spaced apart by the isolation areas 104.

The isolation areas 104 may be formed through a shallow trench isolation (STI) process. The isolation areas 104 may include, for example, a material including at least one of silicon oxide, silicon nitride, and silicon oxynitride. The isolation areas 104 may be a single layer including one kind of insulator, a double layer including two kinds of insulators, or a multilayer including a combination of at least three kinds of insulators. For example, the isolation areas 104 may include silicon oxide and silicon nitride. For example, the isolation areas 104 may include a triple layer including silicon oxide, silicon nitride, and silicon oxynitride.

An insulation layer 108 is formed on the substrate 102 and covers top surfaces of the isolation areas 104 and the active areas 106 of the substrate 102. The insulation layer 108 includes at least one opening that exposes at least one active area among the active areas 106 of the substrate 102. The opening is then filled with a conductive material to form a bit line contact 110. In some embodiments, the bit line contact 110 is electrically connected to the corresponding active area 106, and the portion of the active area 106 serves as source region of a transistor.

A plurality of bit lines 120 are protruded from the substrate 102. In some embodiments, the bit lines 120 may be regularly arranged at substantially equal intervals from each other over the substrate 102. Each of the bit lines 120 may include two portions along a vertical direction substantially perpendicular to the substrate 102 (e.g., along Z direction). In some embodiments, the bit line 120 includes a conductive layer 122 at lower portion, and an insulation capping layer 124 at upper portion.

The formation of the conductive layer 122 and the insulation capping layer 124 includes forming a conductive material layer and an insulation capping material layer sequentially over the substrate 102. The insulation capping material layer may be formed on the first conductive material layer. In one embodiment, both of the first conductive material layer and the insulation capping material layer may be substantially simultaneously etched to form the conductive layer 122 and the insulation capping layer 124. Thus, the bit lines 120 including the conductive layer 122 and the insulation capping layer 124 may be spaced apart from each other in a first direction (e.g., the X direction) and extend in parallel with each other along a second direction (e.g., the Y direction).

In some embodiments, the conductive layer 122 includes at least one material selected from semiconductor with impurities doped thereon, metal, conductive metal nitride, and metal silicide. In some embodiments, the conductive layer 122 may have a stacked structure. For example, the conductive layer 122 may be stacked with materials including doped polysilicon as well as metal nitride or metal such as tungsten, tungsten nitride, and/or titanium nitride. The conductive layer 122 may be electrically connected to the bit line contact 110.

In some embodiments, the insulation capping layer 124 includes silicon nitride. A vertical length (e.g., a length along the Z axis) of the insulation capping layer 124 may be greater than that of the conductive layer 122.

Figure 2:
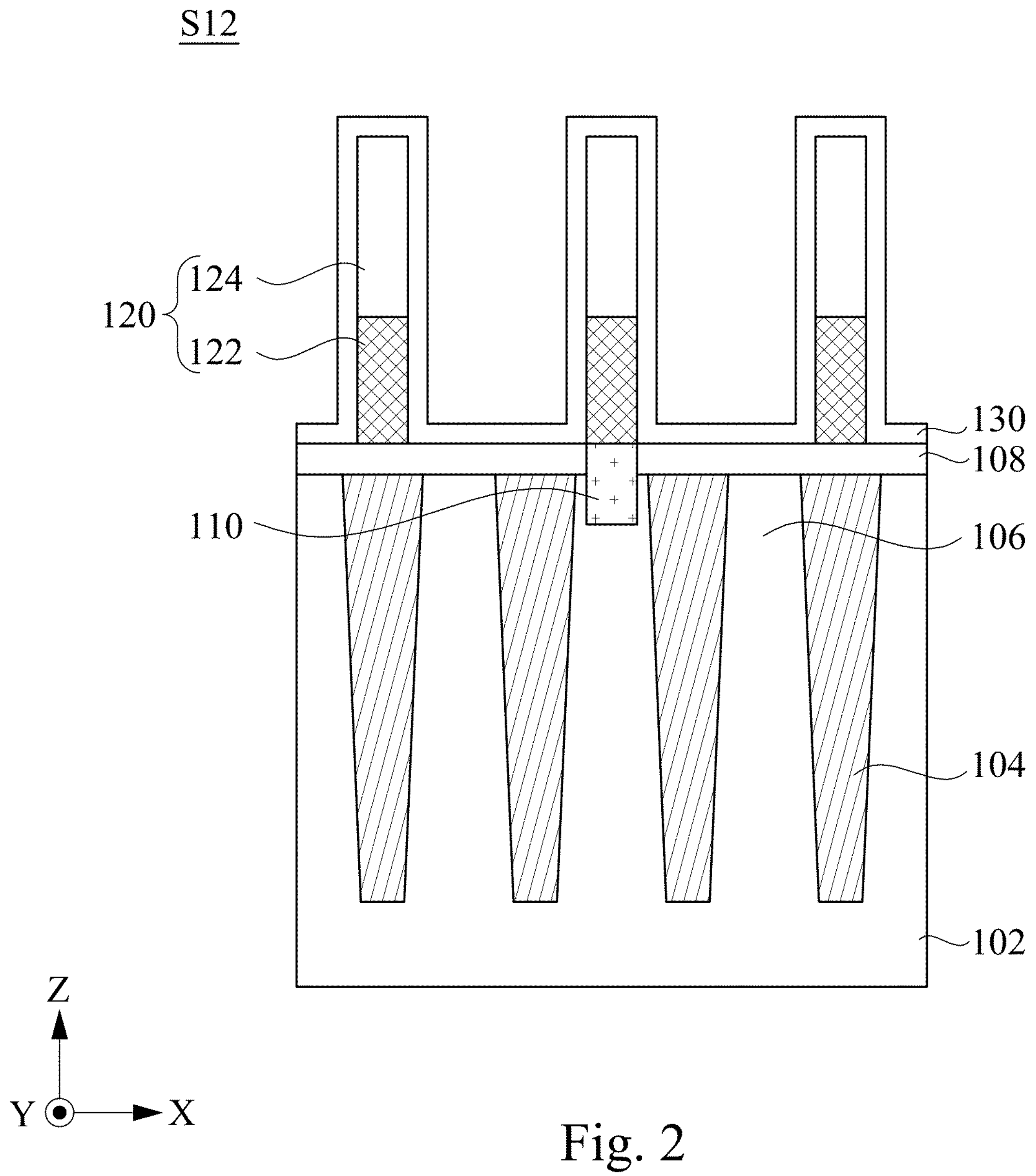

Referring to FIG. 2, the method of forming the semiconductor structure goes to step S12, a spacer layer 130 is formed on the bit lines 120, respectively. The spacer layer 130 extends along sidewalls and top surfaces of the bit lines 120 and along the top surface of the insulation layer 108. The spacer layer 130 may be a single layer structure or multilayer structure. In some embodiments, the spacer layer 130 includes silicon nitride, silicon oxide, or combination thereof. In some embodiments, the spacer layer 130 includes using of sacrificial layer for transforming into an air gap in subsequent fabrication stages. In some embodiments, the spacer layer 130 may be formed by any suitable deposition approaches such as chemical vapor deposition (CVD) techniques, atomic layer deposition (ALD), or physical vapor deposition (PVD) techniques.

Figure 3:
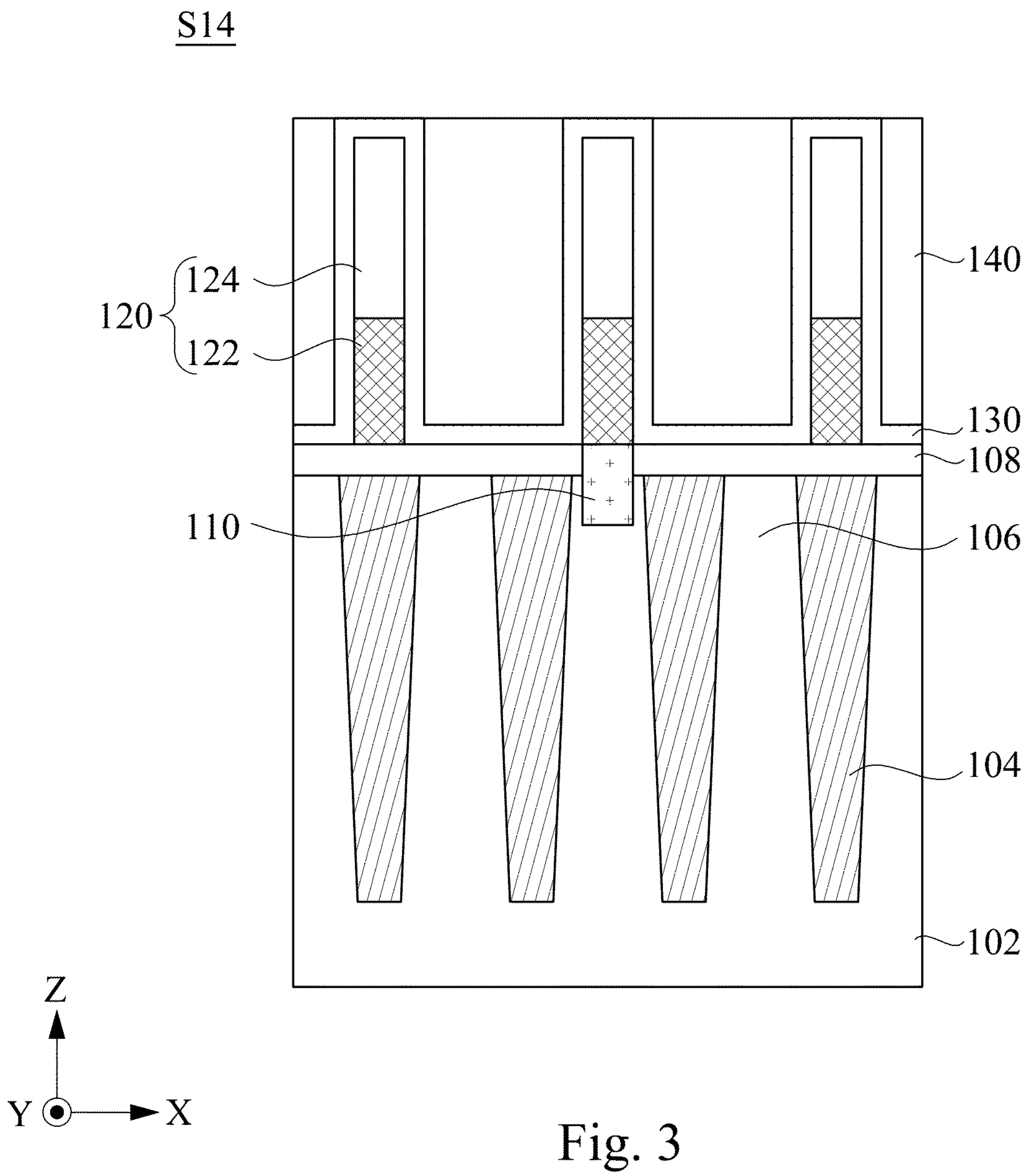

Referring to FIG. 3, the method of forming the semiconductor structure goes to step S14, a dielectric layer 140 is formed between adjacent bit lines 120 along with the spacer layer 130. In some embodiments, the bit lines 120 and the spacer layer 130 thereon are also regarded as bit line structures. The dielectric layer 140 may be disposed on the substrate 102 and in the space between the bit lines 120. The dielectric layer 140 may include, for example, silicon nitride, silicon oxide, or combination thereof. In some embodiments, the dielectric layer 140 is deposited by a deposition process with good filling ability such as a flowable CVD process. Optionally, a planarization process can be performed such that the top surface of the dielectric layer 140 is coplanar with the top surface of the spacer layer 130 on the bit lines 120.

Figure 4:
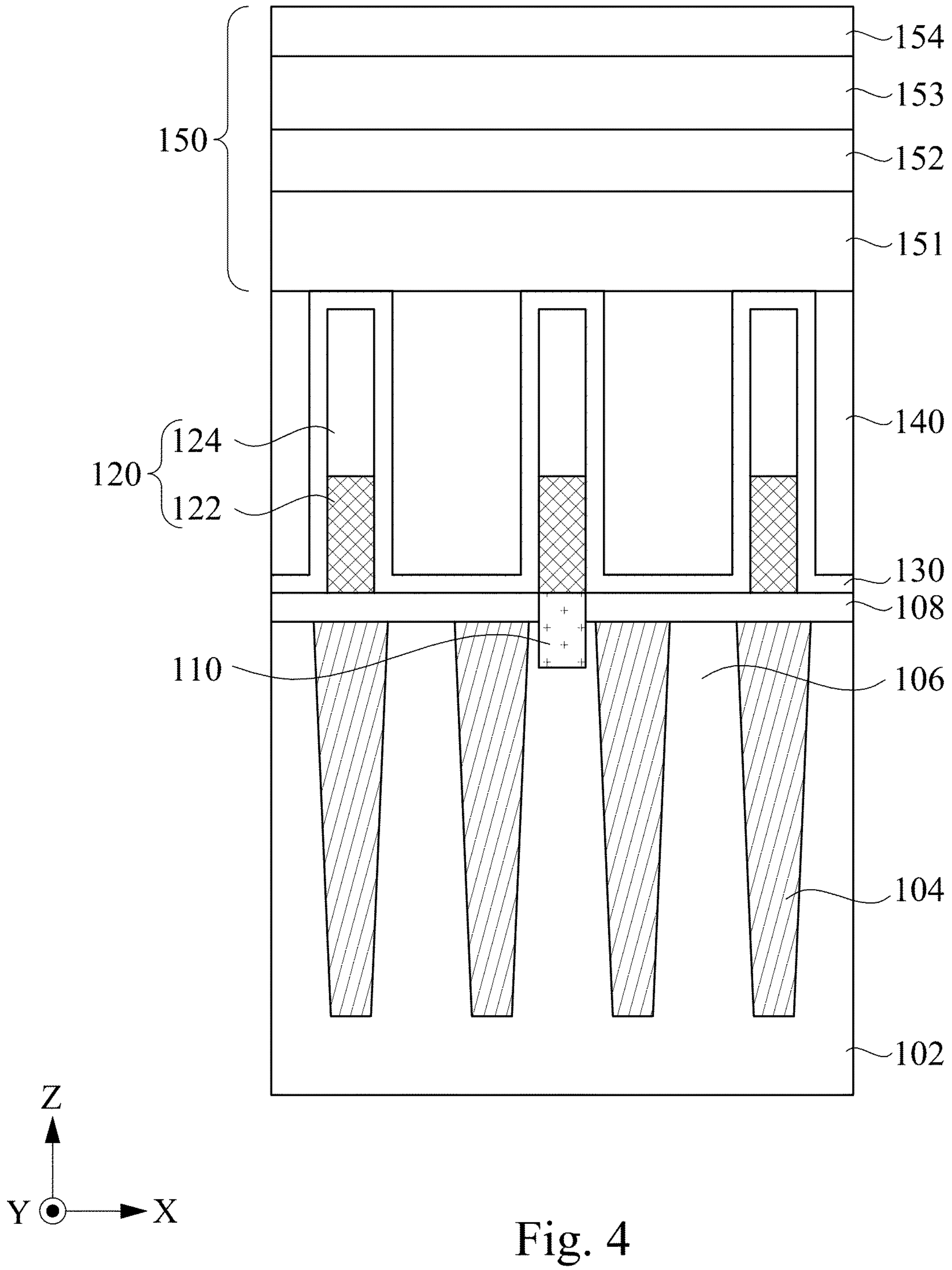

Referring to FIG. 4, the method of forming the semiconductor structure goes to step S16, a bottom segment of a layer stack 150 is formed on the dielectric layer 140. The layer stack 150 includes layers of hard mask material. In some embodiments, the layer stack 150 includes a first layer 151 on the dielectric layer 140, a second layer 152 on the first layer 151, a third layer 153 on the second layer 152, and a fourth layer 154 on the third layer 153. The first layer 151 to the fourth layer 154 can be dielectric.

In some embodiments, the first layer 151 and the second layer 152 can be oxide, and the first layer 151 and the second layer 152 are made of different materials and/or processes. For example, the first layer 151 can be hydrogen silsesquioxane (HSQ) or methyl silsesquioxane (MSQ) and can be made by a spin on dielectric (SOD) process. The second layer 152 can be tetraethylorthosilicate (TEOS) and can be made by a deposition process.

The third layer 153 may be composed of carbon, hydrogen, and oxygen. In some embodiments, the third layer 153 may be composed of carbon, hydrogen, and fluorine. In some embodiments, the third layer 153 may be a carbon film. The term "carbon film" is used herein to describe materials whose mass is primarily carbon, whose structure is defined primarily by carbon atoms, or whose physical and chemical properties are dominated by its carbon content. The term "carbon film" is meant to exclude materials that are simply mixtures or compounds that include carbon, for example dielectric materials such as carbon-doped silicon oxynitride, carbon-doped silicon oxide or carbon-doped polysilicon.

The fourth layer 154 is an anti-reflective coating (ARC) layer. In some embodiments, the fourth layer 154 includes an inorganic material such as silicon oxynitride. More particularly, the fourth layer 154 is an oxygen-rich silicon oxynitride layer, in which an oxygen atom ratio of the fourth layer 154 is in a range from 30% to 50%.

Figure 5:
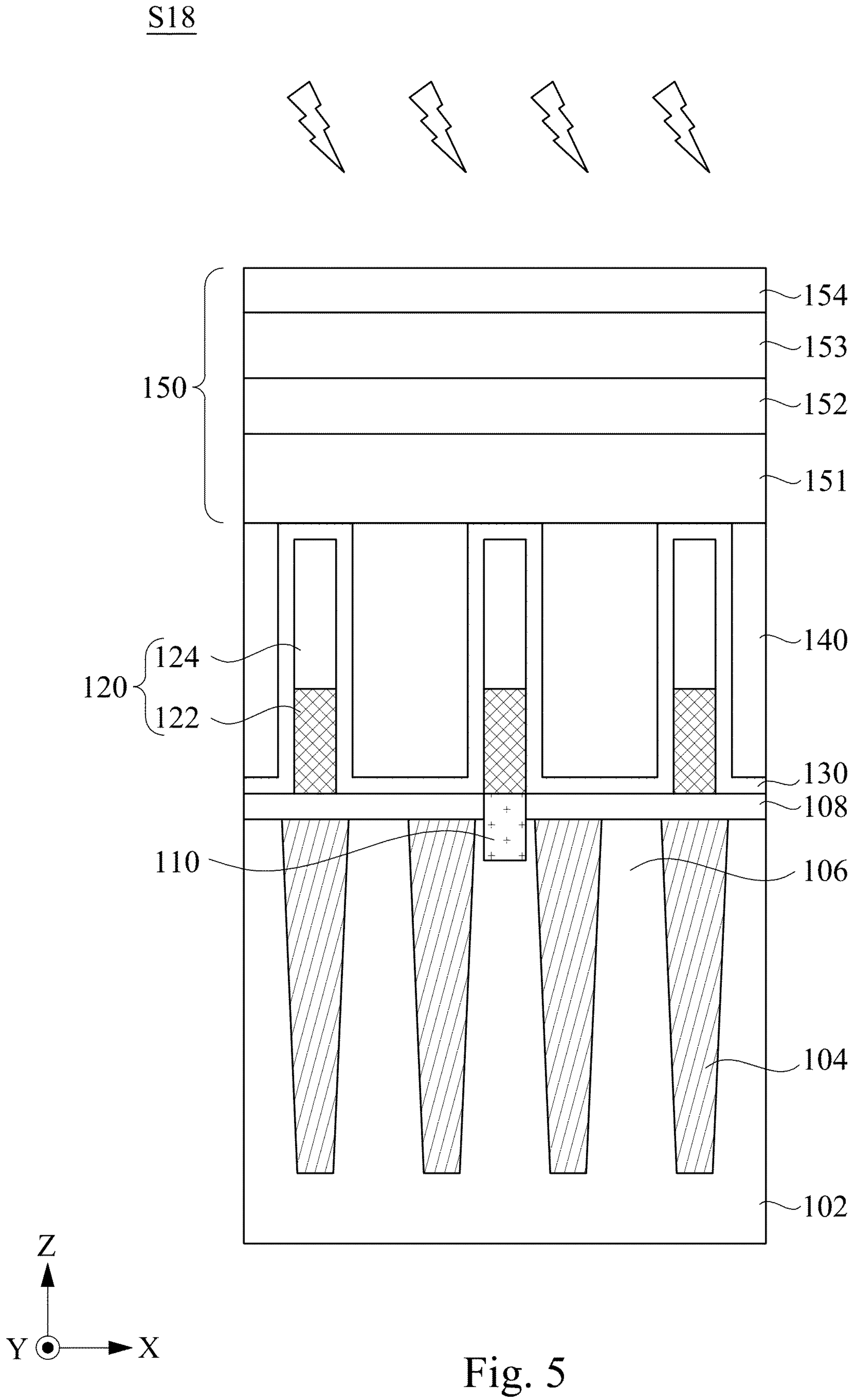

Referring to FIG. 5, the method of forming the semiconductor structure goes to step S18, a plasma treatment process is performed to the fourth layer 154. The plasma treatment process is performed to improve the surface roughness of the fourth layer 154 and/or the adhesion ability between the fourth layer 154 and the layer thereon (not shown). The plasma treatment process includes using He and $N_2O$ as reaction gas, and the treatment power of the plasma treatment process is in a range from 800 W to 1000 W. If the treatment power is less than 800 W, the improvement of the surface roughness and adhesion is not obvious. For example, when the treatment power is increased from 560 W to 1000 W, the surface roughness of the fourth layer 154 is improved from about 0.475 nm to 0.375 nm, and the failure piece count is reduced from 10 to 7 per batch. If the treatment power is greater than 1000 W, unwanted damages of the fourth layer 154 may be generated, and the process time and cost would be increased.

Figure 6:
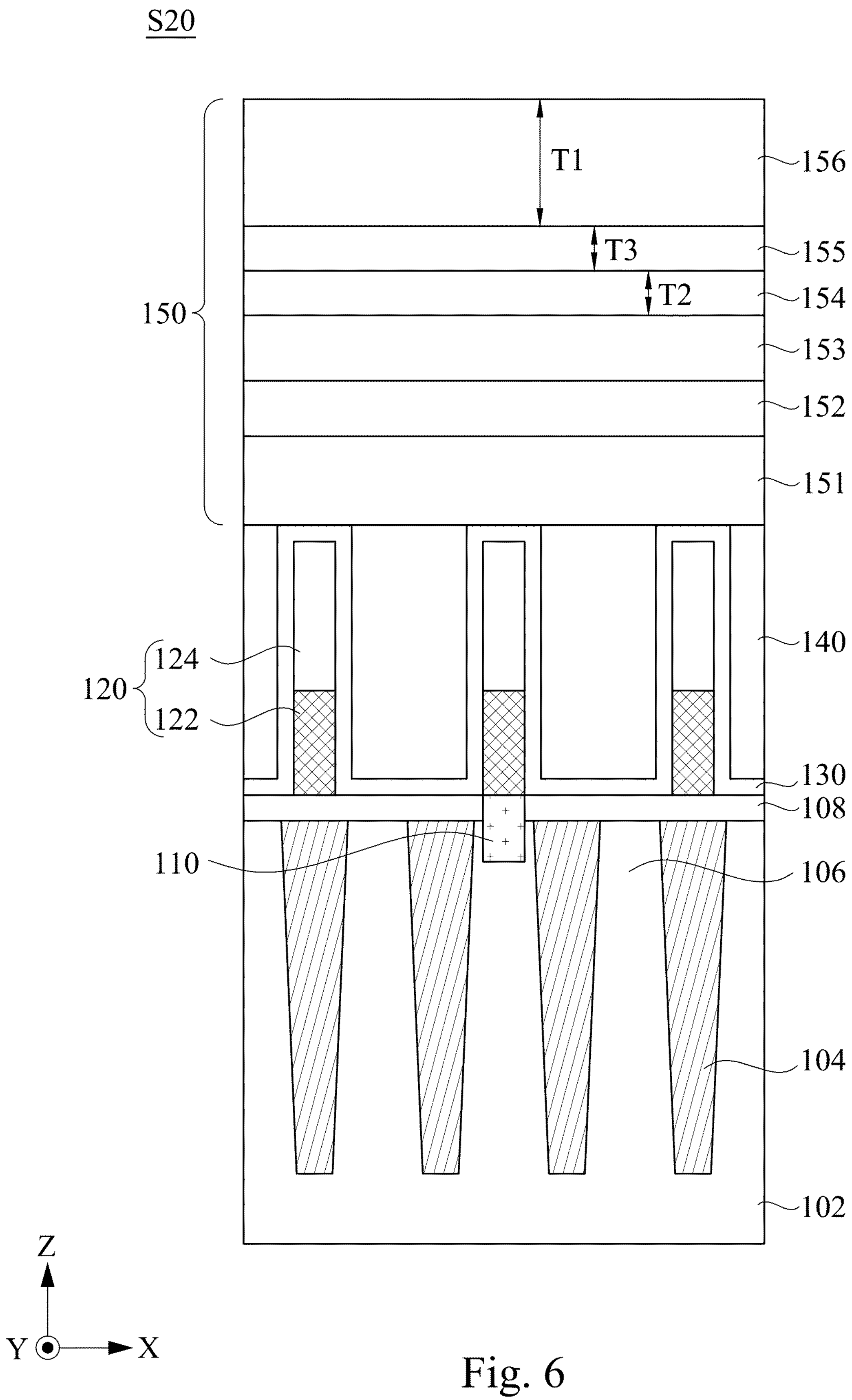

Referring to FIG. 6, the method of forming the semiconductor structure goes to step S20, a top segment of a layer stack 150 is further formed on the fourth layer 154. The layer stack 150 further includes a fifth layer 155 on the fourth layer 154, and a sixth layer 156 on the fifth layer 155.

In some embodiments, the fifth layer 155 is an ARC layer. In some embodiments, the fifth layer 155 includes an inorganic material such as silicon oxynitride. More particularly, the fifth layer 155 is a silicon-rich silicon oxynitride layer, in which a silicon atom ratio of the fifth layer 155 is about 60%. Namely, the fourth layer 154 and the fifth layer 155 together can be regarded as a bi-layer ARC layer. The silicon atom ratio of the fifth layer 155 is higher than that of the fourth layer 154, and the oxygen atom ratio of the fourth layer 154 is higher than that of the fifth layer 155.

After the plasma treatment to the fourth layer 154, the surface roughness of the fourth layer 154 is improved, and the adhesion ability between the interface of the fourth layer 154 and the fifth layer 155 is also improved. The peeling issue between the interface of the fourth layer 154 and the fifth layer 155 can be prevented during the sequentially processes.

In some embodiments, the sixth layer 156 is an under layer including organic materials such as polymer. In some embodiments, the sixth layer 156 is coated on the fifth layer 155, and the thickness T1 of the sixth layer 156 is greater than the sum of the thickness T2 of the fourth layer 154 and the thickness T3 of the fifth layer 155.

Figure 7:
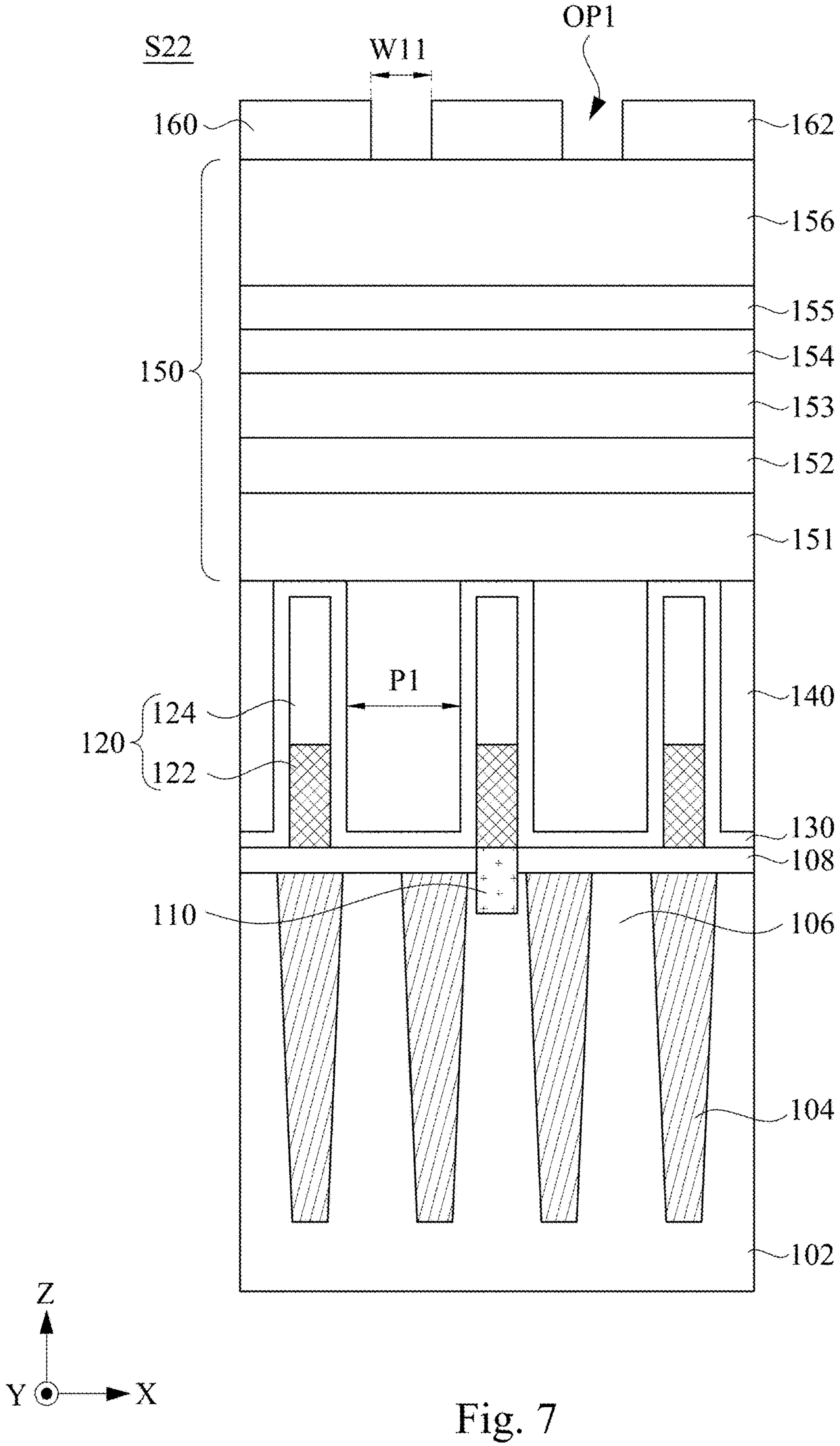

Referring to FIG. 7, the method of forming the semiconductor structure goes to step S22, a patterned mask layer 160 is formed on the layer stack 150. The patterned mask layer 160 includes at least one mask feature 162 and a plurality of openings OP1 in the mask feature 162. In some embodiments, the material of the patterned mask layer 160 includes photoresist, and the mask feature 162 and the openings OP1 can be defined by lithography processes. In some embodiments, the positions of the openings OP1 are corresponding to the contact holes between the bit line structures including the bit lines 120 and the spacer layer 130, and the rest portion other than the contact holes is protected by the mask feature 162. The sixth layer 156 has a different etching selectively to the patterned mask layer 160. Thus the sixth layer 156 can protect the underlying layers and also serve as an etch stop layer.

A pitch P1 is defined between adjacent two of the bit line structures including the bit lines 120 along with the spacer layer 130. More particularly, the pitch P1 is measured between two outmost surfaces of the opposite portions of the spacer layer 130 on the adjacent bit lines 120, in the X direction. Each of the openings OP1 has a width W11. The width W11 of each of the openings OP1 is smaller than the pitch P1 between the adjacent bit line structures. In some embodiments, the sidewall of each of the openings OP1 is substantially vertical to the top surface of the sixth layer 156.

Figure 8A:
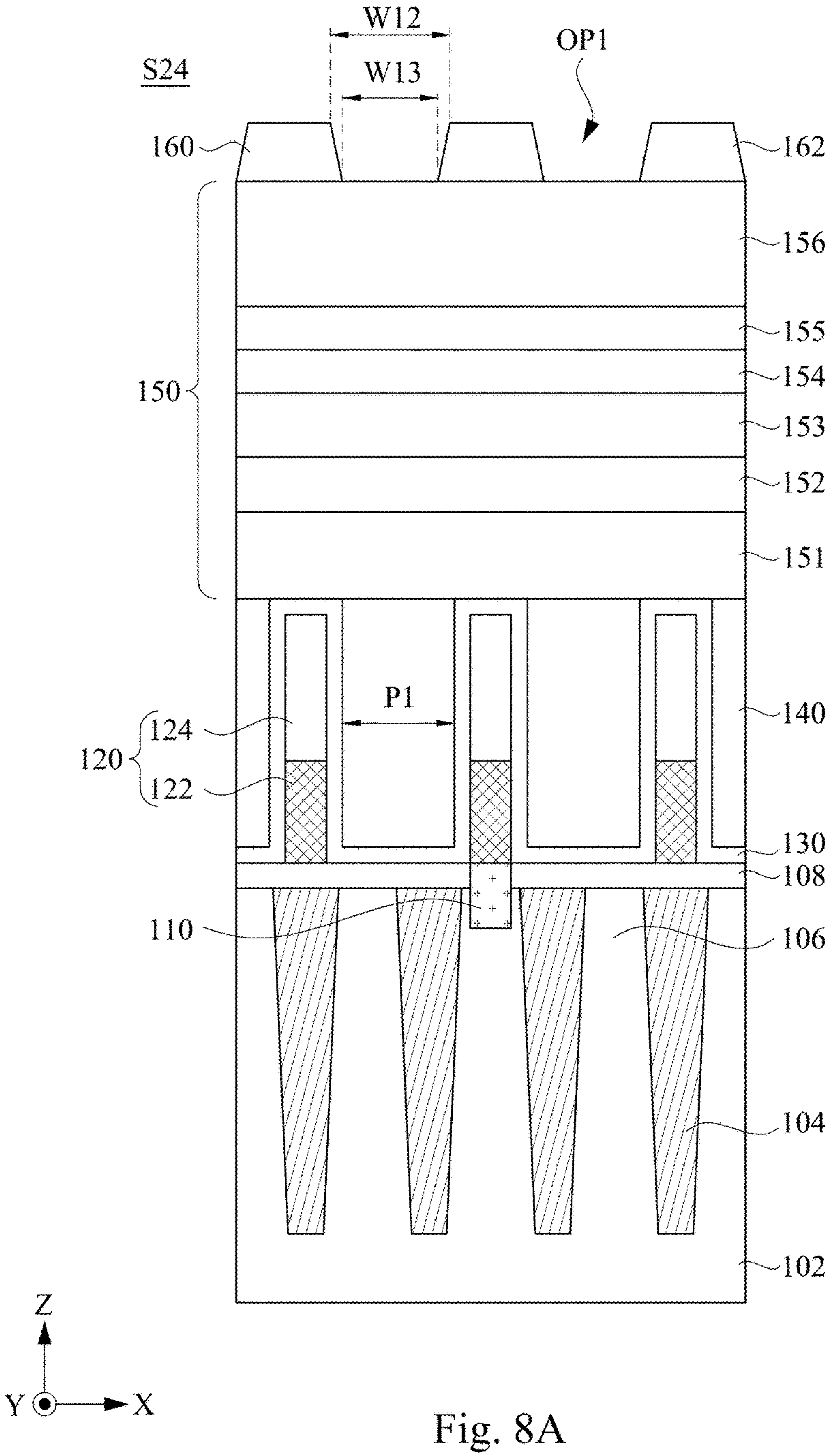

Referring to FIG. 8A, the method of forming the semiconductor structure goes to step S24, a trimming process is performed to the patterned mask layer 160 such that the openings OP1 are enlarged. In some embodiments, the trimming process can be an etching operation and/or another suitable process. In some embodiments, the etching operation includes a directional dry etching, a tilt etching, or other suitable processing. After the trimming process is performed, each of the openings OP1 has a width W12 which is greater than the width W11 prior to performing the trimming process. The width W12 of each of the openings OP1 after the trimming process is substantially equal to the pitch P1 between the adjacent bit line structures.

Figure 8B:
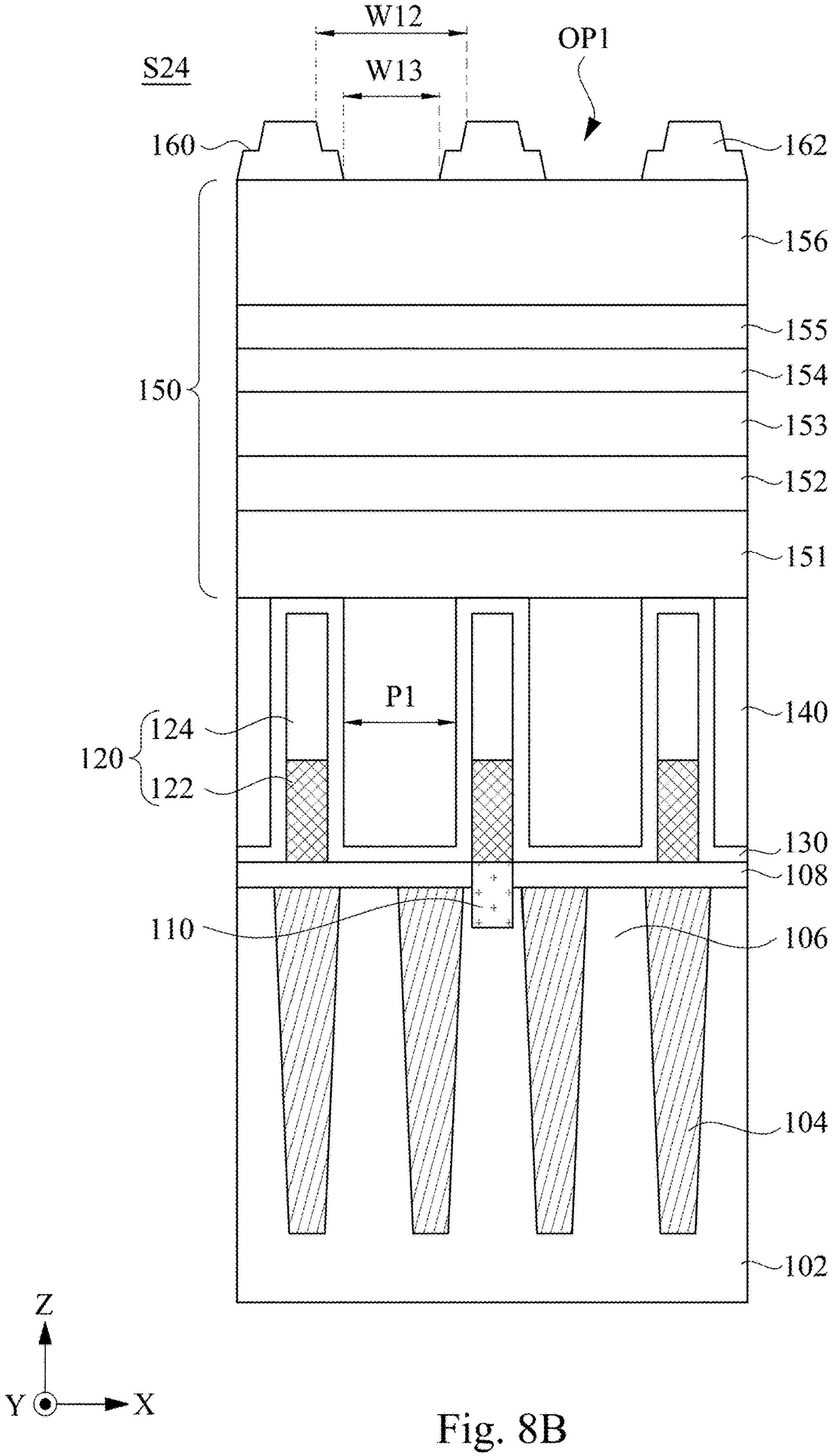

In some embodiments, the trimming process is the directional dry etching or the tilt etching, thus the sidewall of each of the openings OP1 is not vertical to the top surface of the sixth layer 156. For example, each of the openings OP1 has the width W12 defined by the top surface 163 of the mask feature 162 and a width W13 defined by the bottom surface 164 of the mask feature 162. The width W12 is greater than the width W13 and is substantially equal to the pitch P1 between the adjacent bit line structures. In some embodiments, the width of each of the openings OP1 is gradually decreased from the width W12 to the width W13. In some other embodiments, as shown in FIG. 8B, which is an alternative embodiment of step S24 of the disclosure, the width of each of the openings OP1 is stepping decreased from the width W12 to the width W13.

Because the patterned mask layer 160 is patterned and trimmed, the profile of the mask feature 162 is difficult to be controlled. The stress and/or thermal budget during the patterning and trimming process may be accumulated to the layer stack 150. By performing the treatment process to the fourth layer 154, the peeling issue at the interface between the fourth layer 154 and the fifth layer 155 can be prevented, thereby improving the quality of a hard mask formed by the layer stack 150.

Figure 9:
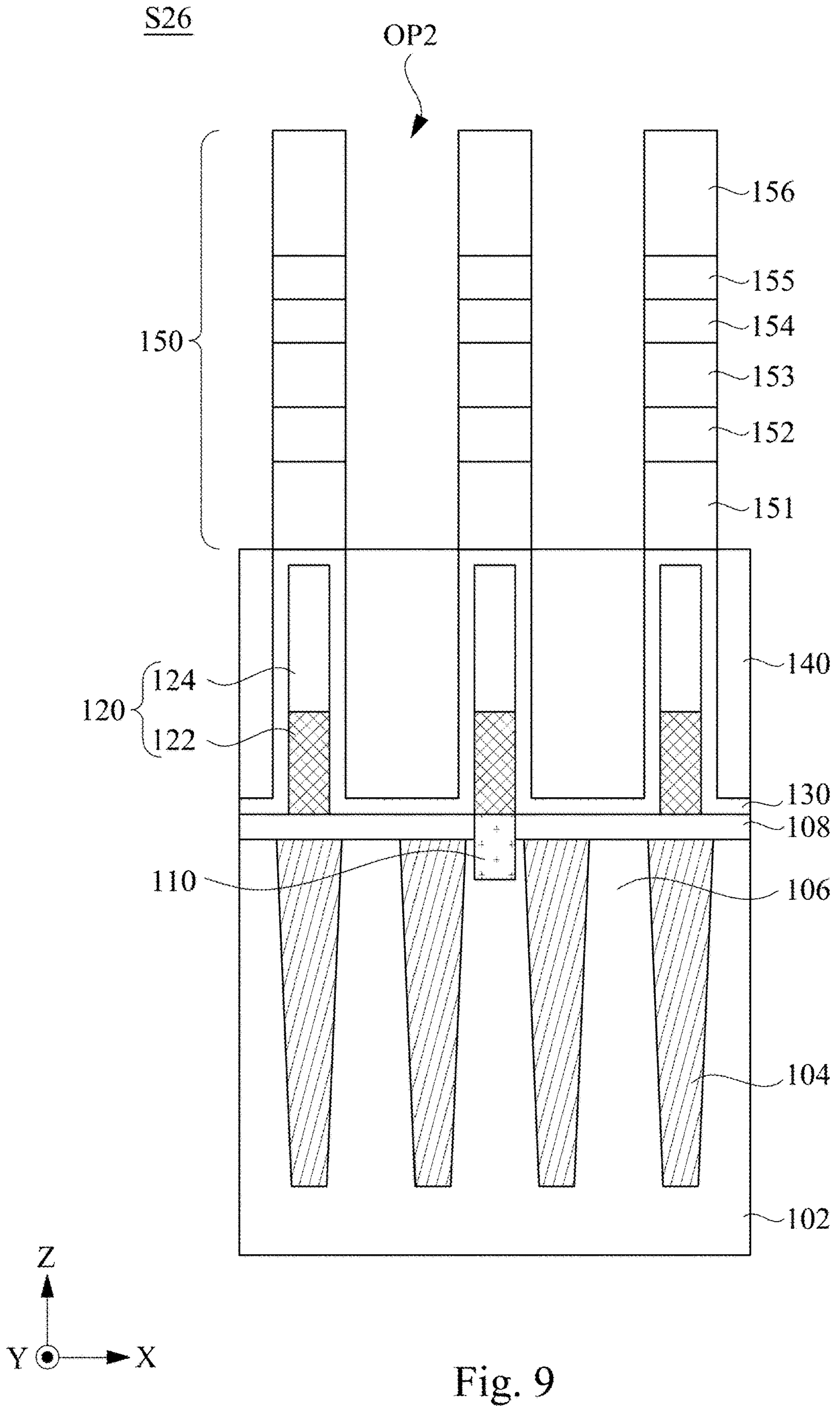

Referring to FIG. 9, the method of forming the semiconductor structure goes to step S26, the layer stack 150 is patterned using the mask feature 162 (see FIG. 8A or 8B) as a mask. The openings OP1 (see FIG. 8A or 8B) are deepened thereby forming openings OP2 surrounded by the layer stack 150. The patterned stack layer 150 can be regarded as the hard mask of etching contact holes in the following steps. Portions of the top surface of the dielectric layer 140 are exposed by the openings OP2 after the layer stack 150 is patterned. In some embodiments, the mask feature 162 can be consumed during patterning the layer stack 150. In some other embodiments, the mask feature 162 can be removed after patterning the layer stack 150.

Figure 10:
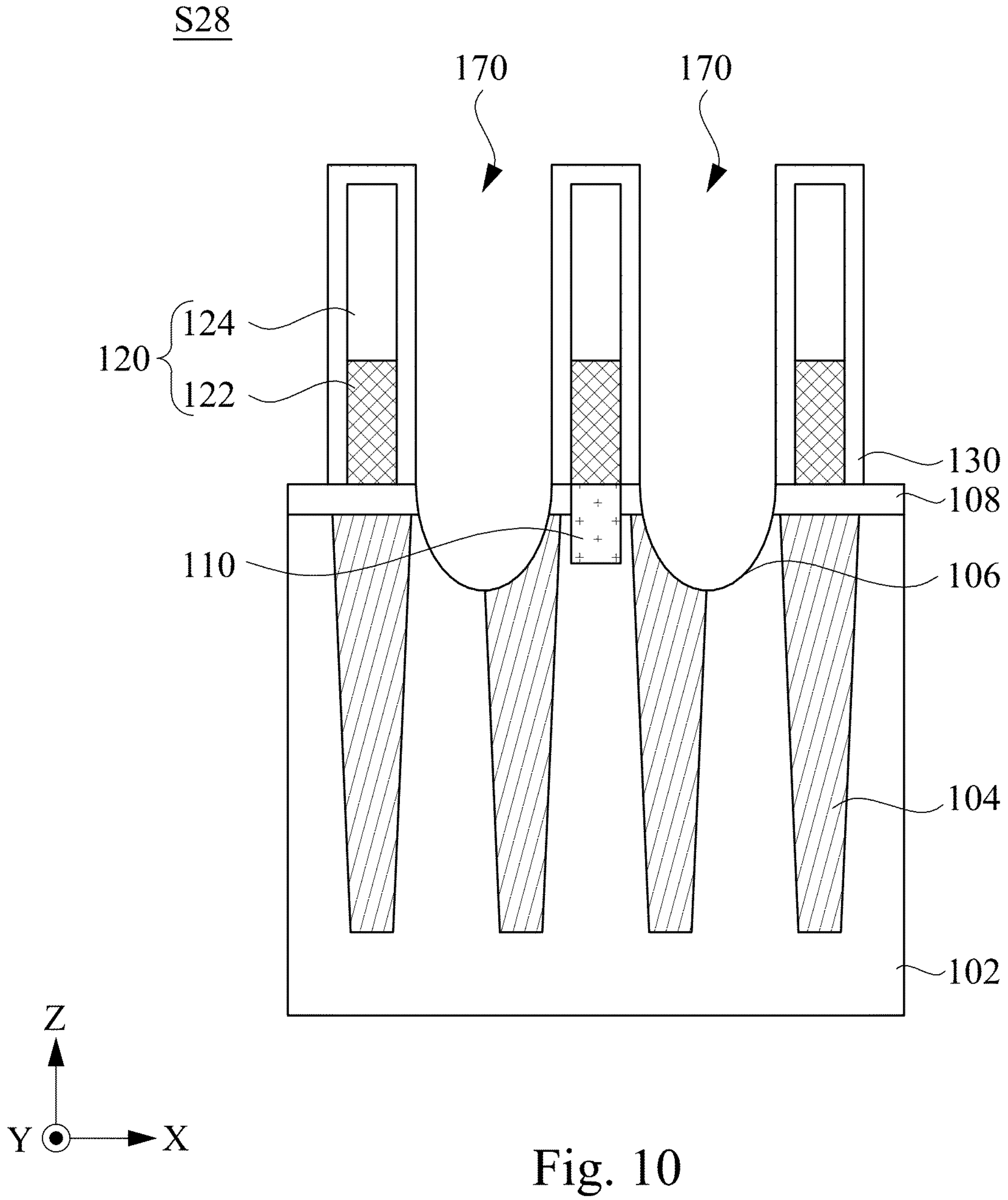

Referring to FIG. 10, the method of forming the semiconductor structure goes to step S28, a plurality of contact holes 170 are formed between the bit line structures. The contact holes 170 are formed by performing an etching process using the patterned layer stack 150 (see FIG. 9) as the hard mask. The peeling issue between the bi-layer ARC layer, e.g. at the interface between the fourth layer 154 and the fifth layer 155 can be reduced by performing the treatment process to enhance the adhesion of the layer stack 150. Therefore, the precision of the formation of the contact holes 170 can be improved.

Portions of the dielectric layer 140, the insulation layer 108, and the substrate 102 uncovered by the patterned layer stack 150 are removed. Removing portions of the substrate 102 includes removing portions of the isolation areas 104 and the active areas 106 such that each of the contact holes 170 has a concave bottom surface below the bit lines 120. In some embodiments, the patterned layer stack 150 can be consumed during forming the contact holes 170. In some other embodiments, the patterned layer stack 150 can be removed after forming the contact holes 170.

Figure 11:
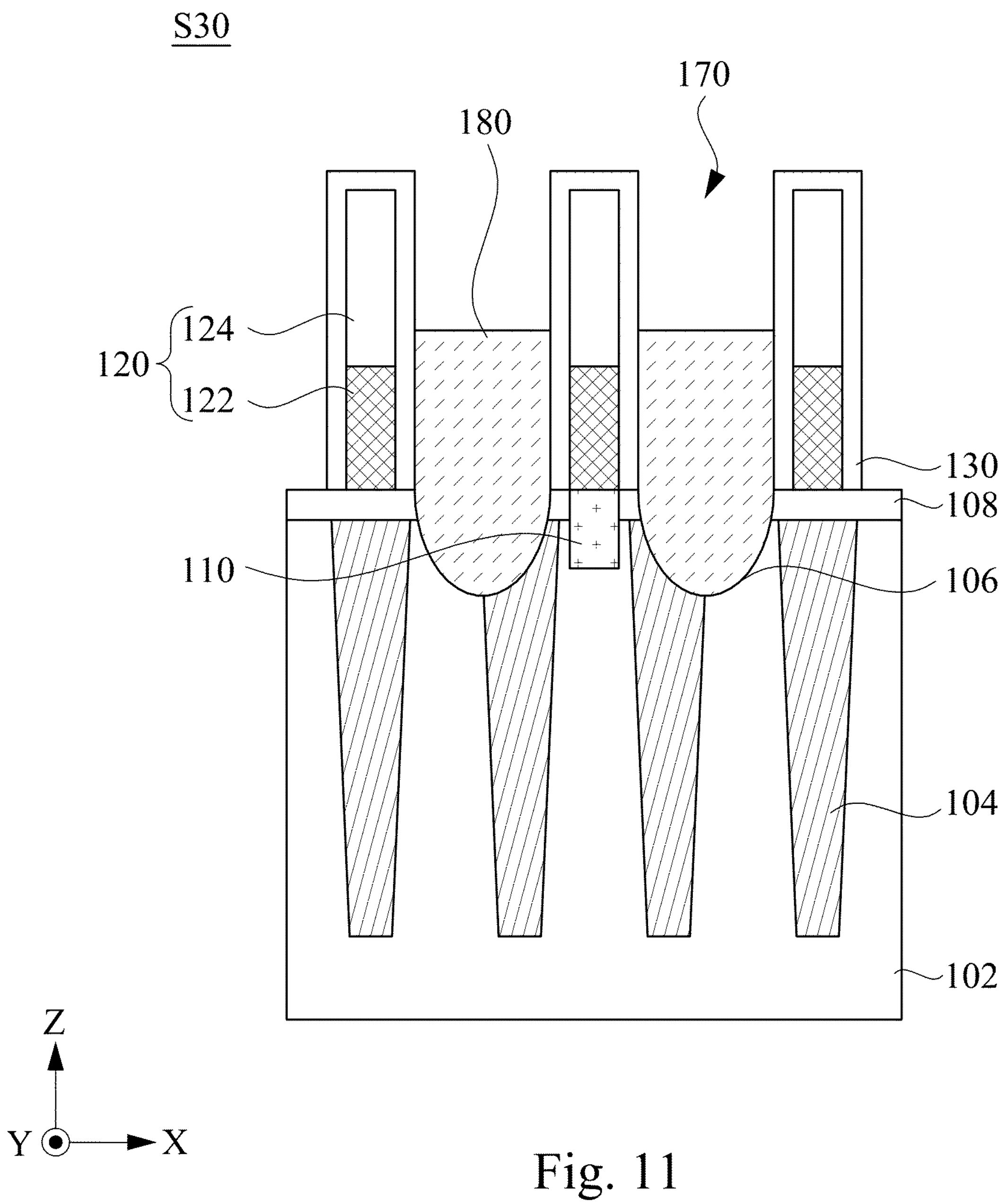

Referring to FIG. 11, the method of forming the semiconductor structure goes to step S30, a plurality of contacts 180 are formed in the contact holes 170, respectively. The formation of the contacts 180 includes depositing a conductive material filling the contact holes 170, and then an etch back process is formed to recess the conductive material in the contact holes 170. In some embodiments, the material of the contacts 180 includes metal such as tungsten or aluminum copper. In some embodiments, the material of the contacts 180 includes metal nitride such as titanium nitride. The contacts 180 are connected to the capacitors (not shown), so that the contacts 180 are also regarded as capacitor contacts.

Figure 12:
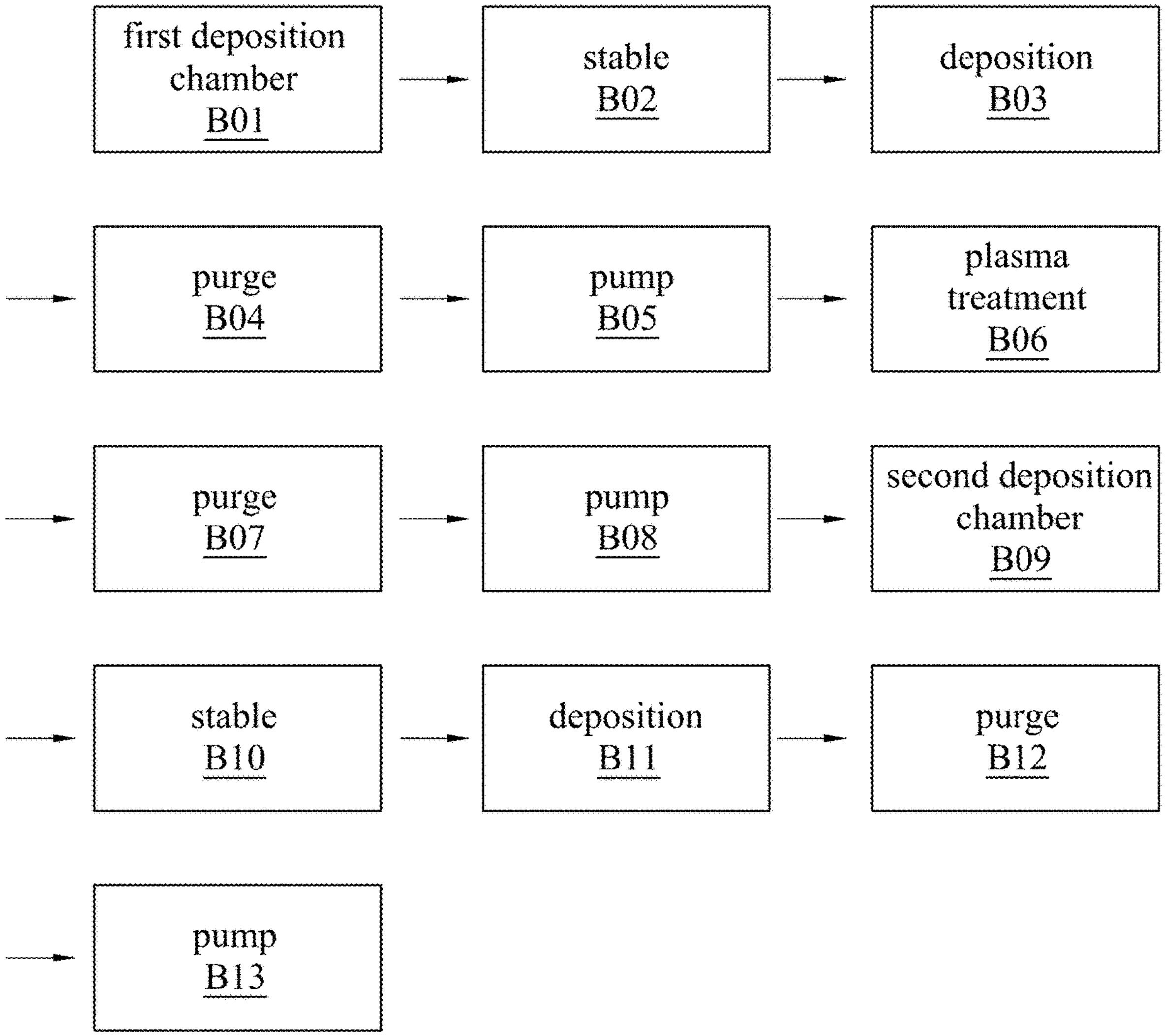
FIG. 12 and FIG. 13 are schematic flows of forming the bi-layer ARC layer of the semiconductor device in accordance with different embodiments of the present disclosure.

Reference is further made to FIG. 12, which is a schematic flow of forming the bi-layer ARC layer of the semiconductor device in accordance with some embodiments of the present disclosure. The schematic flow of forming the bi-layer ARC layer of the semiconductor device begins from block B01, including placing a wafer into a first deposition chamber. The wafer may include the substrate, the bit line structures on the substrate, the dielectric layer covering the bit line structures, and the bottom segment of the layer stack on the dielectric layer.

The schematic flow of forming the bi-layer ARC layer of the semiconductor device then goes to block B02, the first deposition chamber is adjusted to a stable state, in which the temperature and pressure of the first deposition chamber are adjusted to desired temperature and pressure. In block B03, an oxygen-rich ARC layer such as an oxygen-rich silicon oxynitride layer is deposited on the wafer. The deposition process of depositing the oxygen-rich ARC layer is a plasma enhanced chemical vapor deposition process (PECVD). The gas utilized in the PECVD process includes silicon-containing gas and nitrogen containing gas, such as $SiH_4/N_2O$. An oxygen atom ratio of the oxygen-rich ARC layer is in a range from 30% to 50%.

In block B04, a purge gas such as nitrogen or inter gas is introduced into the first deposition chamber, and the purge gas is pumped out in block B05 to complete the cleaning process of the first deposition chamber.

In block B06, the plasma treatment process is performed to the oxygen-rich ARC layer. The plasma treatment process improves the surface roughness of oxygen-rich ARC layer. The plasma treatment process includes using He and $N_2O$ as reaction gas, and the treatment power of the plasma treatment process is in a range from 800 W to 1000 W. If the treatment power is less than 800 W, the improvement of the surface roughness and adhesion is not obvious. If the treatment power is greater than 1000 W, unwanted damages of the oxygen-rich ARC layer may be generated, and the process time and cost would be increased.

After the oxygen-rich ARC layer is plasma treated, the flow goes to block B07, the purge gas such as nitrogen or inter gas is introduced into the first deposition chamber, and the purge gas is pumped out in block B08 to complete the cleaning process of the wafer.

Then, block B09 includes moving the wafer from the first deposition process into a second deposition process. In block B10, the second deposition chamber is adjusted to a stable state, in which the temperature and pressure of the second deposition chamber are adjusted to desired temperature and pressure. In block B11, a silicon-rich ARC layer such as a silicon-rich silicon oxynitride layer is deposited on the oxygen-rich ARC layer of the wafer. In some embodiments, the deposition process of depositing the silicon-rich ARC layer is a PECVD process, and the gas utilized in the PECVD process includes silicon-containing gas and nitrogen containing gas, such as $SiH_4/N_2O$. A silicon atom ratio of the silicon-rich ARC layer is about 60%. In some other embodiments, the deposition process of depositing the silicon-rich ARC layer can be other suitable process other than PECVD.

After the silicon-rich ARC layer is plasma treated, the flow goes to block B12, the purge gas such as nitrogen or inter gas is introduced into the second deposition chamber, and the purge gas is pumped out in block B13 to complete the cleaning process of the wafer.

The oxygen-rich ARC layer and the silicon-rich ARC layer are deposited in the first deposition chamber and the second deposition chamber, respectively, so that bi-layer ARC layer with plasma treatment can be regarded as formed by an ex-situ deposition. That is, the selection of the second deposition chamber is not limited to the PECVD chamber and can be more flexible. Additionally, the adhesion ability between the interface of the oxygen-rich ARC layer and the silicon-rich ARC layer is improved by plasma treating the oxygen-rich ARC layer prior to depositing the silicon-rich ARC layer.

Figure 13:
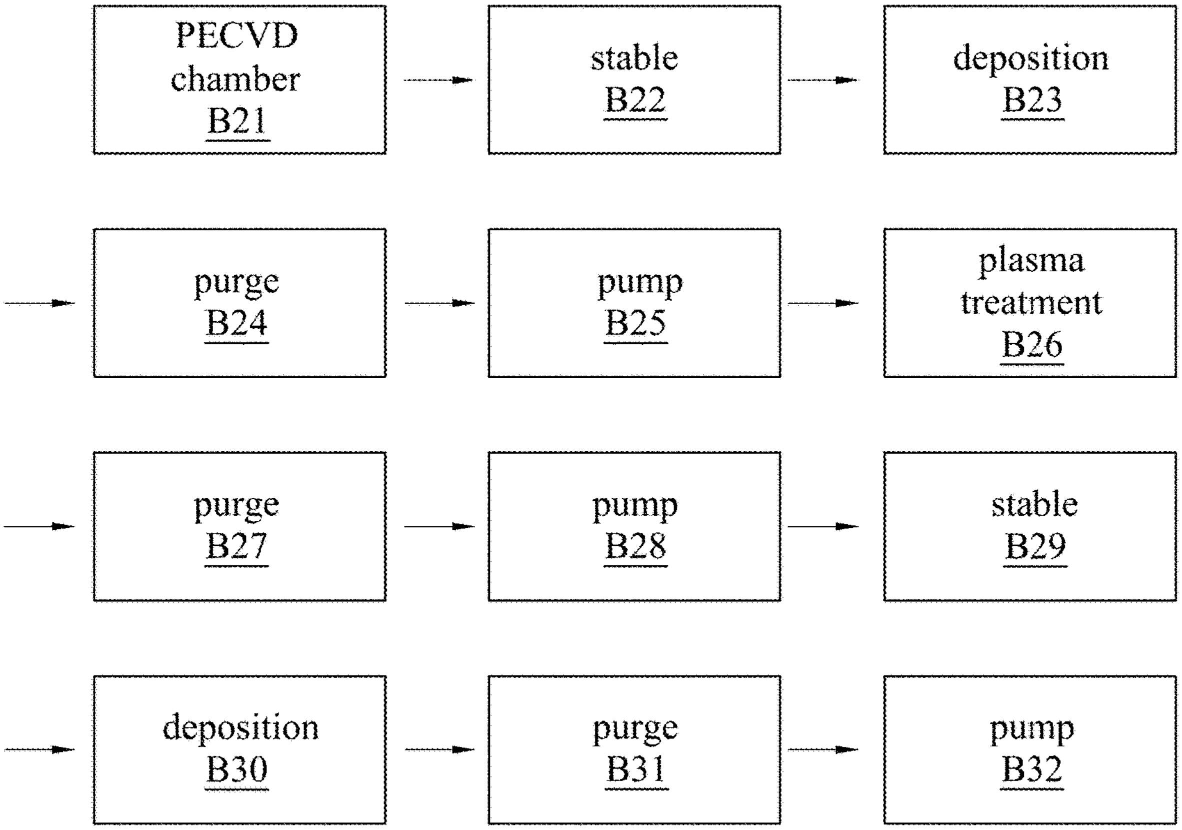

Reference is further made to FIG. 13, which is a schematic flow of forming the bi-layer ARC layer of the semiconductor device in accordance with some other embodiments of the present disclosure. The schematic flow of forming the bi-layer ARC layer of the semiconductor device begins from block B21, including placing a wafer into a PECVD chamber. The wafer may include the substrate, the bit line structures on the substrate, the dielectric layer covering the bit line structures, and the bottom segment of the layer stack on the dielectric layer.

The schematic flow of forming the bi-layer ARC layer of the semiconductor device then goes to block B22, the PECVD chamber is adjusted to a stable state, in which the temperature and pressure of the PECVD chamber are adjusted to desired temperature and pressure. In block B23, an oxygen-rich ARC layer such as an oxygen-rich silicon oxynitride layer is deposited on the wafer. The deposition process of depositing the oxygen-rich ARC layer is a PECVD process. The gas utilized in the PECVD process includes silicon-containing gas and nitrogen containing gas, such as $SiH_4/N_2O$. An oxygen atom ratio of the oxygen-rich ARC layer is in a range from 30% to 50%.

In block B24, a purge gas such as nitrogen or inter gas is introduced into the PECVD chamber, and the purge gas is pumped out in block B25 to complete the cleaning process of the PECVD chamber.

In block B26, the plasma treatment process is performed to the oxygen-rich ARC layer. The plasma treatment process improves the surface roughness of oxygen-rich ARC layer. The plasma treatment process includes using He and $N_2O$ as reaction gas, and the treatment power of the plasma treatment process is in a range from 800 W to 1000 W. If the treatment power is less than 800 W, the improvement of the surface roughness and adhesion is not obvious. If the treatment power is greater than 1000 W, unwanted damages of the oxygen-rich ARC layer may be generated, and the process time and cost would be increased.

After the oxygen-rich ARC layer is plasma treated, the flow goes to block B27, the purge gas such as nitrogen or inter gas is introduced into the PECVD chamber, and the purge gas is pumped out in block B28 to complete the cleaning process of the wafer.

In block B29 the PECVD chamber is adjusted to a stable state, in which the temperature and pressure of the PECVD chamber are adjusted to desired temperature and pressure. Then, block B30 includes depositing a silicon-rich ARC layer such as a silicon-rich silicon oxynitride layer on the oxygen-rich ARC layer of the wafer. In some embodiments, the gas utilized in the PECVD process includes silicon-containing gas and nitrogen containing gas, such as $SiH_4/N_2O$. A silicon atom ratio of the silicon-rich ARC layer is about 60%.

After the silicon-rich ARC layer is plasma treated, the flow goes to block B31, the purge gas such as nitrogen or inter gas is introduced into the PECVD chamber, and the purge gas is pumped out in block B32 to complete the cleaning process of the wafer.

The oxygen-rich ARC layer and the silicon-rich ARC layer are deposited in the same PECVD chamber, without transferring the wafer between the chambers, so that bi-layer ARC layer with plasma treatment can be regarded as formed by an in-situ deposition. The time of depositing and treating the wafer is greatly reduced.

Comparing to the ex-situ process which deals about 109.6 pieces per hour, and the surface roughness of the oxygen-rich ARC layer is about 0.475 nm, the in-situ process can deal about 117.4 pieces per hour, and the surface roughness of the oxygen-rich ARC layer is about 0.375 nm. Therefore, the adhesion ability between the interface of the oxygen-rich ARC layer and the silicon-rich ARC layer and the yield of the wafer are improved by in-situ plasma treating the oxygen-rich ARC layer prior to depositing the silicon-rich ARC layer.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims and their equivalents.

What is claimed is:

1. A method of manufacturing a semiconductor structure comprising:
- forming a plurality of bit line structures on a substrate;
- forming a dielectric layer on the substrate and between the bit line structures;
- forming a layer stack on the dielectric layer, wherein the layer stack comprises a plasma treated oxygen-rich anti-reflective coating (ARC) layer and a silicon-rich ARC layer on the plasma treated oxygen-rich ARC layer;
- forming a patterned mask layer on the layer stack, wherein the patterned mask layer comprises a mask feature and an opening defined by the mask feature, the opening has a first width smaller than a pitch between adjacent two of the bit line structures;
- trimming the patterned mask layer to enlarge the opening such that the opening has a second width greater than the first width;
- patterning the layer stack by using patterned mask layer as a mask after trimming the patterned mask layer; and
- etching the substrate to form a contact hole between the bit line structures by using the patterned layer stack as a hard mask.

2. The method of claim 1, wherein the trimming the patterned mask layer comprises a directional dry etching or a tilt etching.

3. The method of claim 2, wherein a sidewall of the opening having the second width is not vertical to a top surface of the layer stack.

4. The method of claim 3, wherein the second width of the opening is gradually decreased from a top surface to a bottom surface of the mask feature.

5. The method of claim 3, wherein the second width of the opening is stepping decreased from a top surface to a bottom surface of the mask feature.

6. The method of claim 1, wherein the second width is equal to the pitch between adjacent two of the bit line structures.

7. The method of claim 1, wherein forming the layer stack comprises:
- forming a first layer comprising oxygen on the dielectric layer;
- forming a second layer comprising oxygen on the first layer;
- forming a third layer comprising carbon on the second layer;
- forming an oxygen-rich ARC layer on the third layer;
- performing a plasma treatment process to the oxygen-rich ARC layer; and forming the silicon-rich ARC layer on the plasma treated oxygen-rich ARC layer.

8. The method of claim 7, wherein the plasma treatment process comprises using He and $N_2O$ as reaction gas.

9. The method of claim 7, wherein a treatment power of the plasma treatment process is in a range from 800 W to 1000 W.

10. The method of claim 7, wherein forming the layer stack comprises:

forming an under layer comprises photoresist on the silicon-rich ARC layer, wherein the patterned mask layer is formed on the under layer.

11. The method of claim 7, wherein the oxygen-rich ARC layer is formed in a first deposition chamber, and the silicon-rich ARC layer is formed in a second deposition chamber.

12. The method of claim 11, wherein the plasma treatment process is performed in the first deposition chamber.

13. The method of claim 7, wherein the oxygen-rich ARC layer and the silicon-rich ARC layer are formed in the same plasma enhanced chemical vapor deposition process (PECVD) chamber.

14. The method of claim 13, wherein the plasma treatment process is performed in the PECVD chamber.

15. The method of claim 1, further comprising forming a capacitor contact in the contact hole.

16. A method of manufacturing a semiconductor structure comprising:

forming a plurality of bit line structures on a substrate;

forming a dielectric layer on the substrate and between the bit line structures;

depositing an oxygen-rich anti-reflective coating (ARC) layer on the dielectric layer;

performing a plasma treatment process to the oxygen-rich ARC layer, wherein the plasma treatment process comprises using He and $N_2O$ as reaction gas, and a treatment power of the plasma treatment process is in a range from 800 W to 1000 W; and forming a silicon-rich ARC layer on the plasma treated oxygen-rich ARC layer.

17. The method of claim 16, wherein the oxygen-rich ARC layer is deposited in a first deposition chamber, and the silicon-rich ARC layer is deposited in a second deposition chamber.

18. The method of claim 17, wherein the plasma treatment process is performed in the first deposition chamber.

19. The method of claim 16, wherein the oxygen-rich ARC layer and the silicon-rich ARC layer are deposited in the same plasma enhanced chemical vapor deposition process (PECVD) chamber.

20. The method of claim 19, wherein the plasma treatment process is performed in the PECVD chamber.

* * * * *